United States Patent [19]

Hansen

[11] 3,961,268
[45] June 1, 1976

[54] DISTURBANCE PULSE DETECTOR CIRCUIT FOR RADIO RECEIVER BLANKING

[75] Inventor: Jens Hansen, Hildesheim, Germany

[73] Assignee: Blaupunkt-Werke GmbH, Hildesheim, Germany

[22] Filed: June 30, 1975

[21] Appl. No.: 591,318

[30] Foreign Application Priority Data

Mar. 20, 1975 Germany............................ 2512239

[52] U.S. Cl................................. 325/478; 325/348; 325/477
[51] Int. Cl.².......................................... H04B 1/10
[58] Field of Search ........... 325/348, 349, 371, 377, 325/383, 425, 473–478, 480; 179/1 P, 15 BT; 178/DIG. 12

[56] References Cited
UNITED STATES PATENTS

| | | |
|---|---|---|
| 2,802,939 | 8/1957 | Klehfoth .............................. 325/478 |
| 3,213,372 | 10/1965 | Kurvits................................ 325/478 |
| 3,568,068 | 3/1971 | Russell, Jr........................... 325/348 |
| 3,919,482 | 11/1975 | Hamada.............................. 325/478 |

Primary Examiner—Robert L. Griffin
Assistant Examiner—Jin F. Ng
Attorney, Agent, or Firm—William R. Woodward

[57] ABSTRACT

Two disturbance recognition circuits are supplied in parallel with the output of the receiver demodulator, one of them having a threshold characteristic with a sensitivity maximum only slightly above the frequency band of the received signal and a steep sensitivity frequency characteristic between that maximum and the upper edge of the signal band, while the other recognition circuit has its sensitivity well above the main sensitivity range of the first-mentioned recognition circuit. An AND-circuit is provided at the ouputs of the recognition circuits so that a blanking pulse will be produced only when both recognition circuits respond. The output pulse of the recognition circuit with the higher frequency sensitivity is broadened so that it will persist in the AND-circuit long enough to allow for the slower response time of the other recognition circuit. Blanking is disabled by a parallel switch when the rate of operation of the AND-circuit reaches a rate at which audible effects would be produced anyway.

11 Claims, 3 Drawing Figures

DISTURBANCE PULSE DETECTOR CIRCUIT FOR RADIO RECEIVER BLANKING

This invention relates to disturbance pulse detection circuits for interference blanking circuits of a radio receiver.

Interference blanking circuits for radio receivers are known and are increasingly utilized in automobile radio receivers, because they offer advantages in reception quality and cannot be obtained by presently used techniques for suppressing radio interference produced by the motor vehicle. Interference blanking circuits also operate to eliminate or mitigate the effects of disturbances that are not generated by the vehicle itself, as for example atmospheric disturbances ("static") or disturbances produced by passing vehicles not equipped with radio interference suppressing devices or systems.

Known forms of such interference blanking circuits comprise a blanking switch interposed behind the demodulator of the receiver, a storage device and a disturbance pulse detector. When a disturbance pulse appears, the disturbance pulse detector opens the blanking switch, so that the signal path of the radio receiver is interrupted. At this time, instead of the disturbed signal, a voltage stored behind the switch (i.e. on the side of the switch towards which the signal is fed when the switch is closed) in a storage circuit is switched into the on-going signal path instead of the disturbed signal. The stored voltage corresponds to the momentary signal value directly before the beginning of the disturbance.

The reliability of a disturbance pulse blanking circuit depends primarily on the disturbance pulse detector. A known disturbance pulse detector includes a resonant circuit arranged to be excited into damped oscillations by frequency components of a disturbance that lie in a frequency region determined by the resonant circuit. The oscillation is amplified and rectified and the resulting voltage is used to control a monostable multivibrator that determines the duration of the blanking interval.

The circuit just described provides good results for the case of reception of strong signals. If the receiver is tuned to a weak signal, however, the background noise is so great that the disturbance pulse detector cannot distinguish between the background noise and a disturbance and the circuit is not practical.

It is an object of the present invention to provide a disturbance pulse detection circuit for interference blanking that makes possible trouble-free operation even in the case of reception of weak signals.

SUBJECT MATTER OF THE PRESENT INVENTION:

Briefly, the disturbance pulse detector is constituted so as to include two disturbance recognition circuits, one for high-frequency disturbance components and the other for disturbance components lying barely above the signal band occupied by the signal to be demodulated and used in the receiver, and the blanking switch is arranged to operate only when both interference recognition circuits operate. The invention is based upon the recognition that a reliable disturbance recognition cannot be provided by the recognition of the high-frequency disturbance components only, as already mentioned above, and that in the case of weak signal reception, a significant difference between background noise and a disturbance that can effectively be blanked is present only in the case of a disturbance detector that has its greatest sensitivity only a little above the useful frequency band of the demodulated signal. Since the latter type of disturbance detector cannot assure, at tolerable cost, the absence of a certain tendency to operate also in response to some useful signals in the demodulator output, it is quite possible for such a detector operating to receive strong signals at high percentages of modulation to deliver disturbance recognition signals that are generated from the signal being received and not from disturbance pulses. On the other hand, for these reception conditions, the other disturbance pulse detector, designed to respond to high-frequency disturbance components, operates without difficulty. By the interconnection in accordance with the invention of the two disturbance pulse detectors, utilizing an AND-circuit, an error-free disturbance pulse recognition operation is achieved.

Preferably, both the first and the second disturbance recognition circuits are provided with separate output threshold switches for positive-going and negative-going disturbance pulses respectively, each of them having equal access to an output circuit causing the discharge of a capacitor which provides the output operation of the particular disturbance recognition circuit supplied to the AND-gate that operates the blanking switch. The AND-gate itself may set off a capacitor discharge, which is somewhat simpler than having it operate a monostable flip-flop circuit. Preferably, another capacitor is arranged to be progressively charged or discharged by the final control pulses applied to the blanking switch and thereby to cause the blanking switch to be bridged and made ineffective when a predetermined rate of incidence of blanking control pulses per unit of time is exceeded.

In the case of stereo broadcast receivers, it is desirable for the region of greatest sensivity of the first disturbance recognition circuit to lie between 70 and 100 kHz and for the sensitivity of the second disturbance recognition circuit to be greatest above 200 kHz.

It is useful to provide for a slight delay or stretching of the output of the second disturbance recognition circuit, so that its effect will not be dissipated before the first signal recognition circuit has a chance to operate. Only a slight amount of delay is necessary and that can be produced without great expense or complication.

The above-mentioned precaution of disabling the blanking switch when a certain rate of blanking control pulses per unit of time is exceeded is useful to prevent long blanking periods that may be produced by high-frequency oscillations occurring in the receiver such as can be produced during the tuning process.

The invention is further described by way of an illustrative example with reference to the accompanying drawings, in which.

Figure 1:
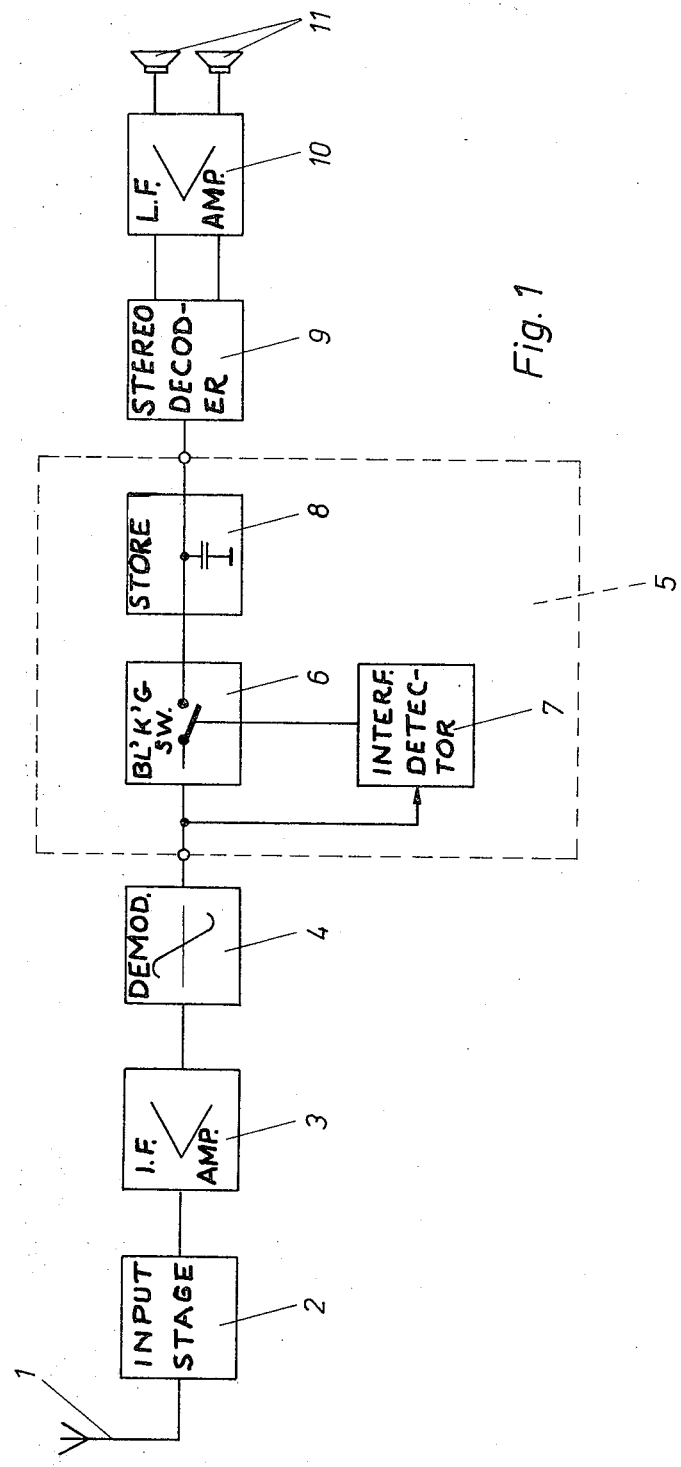
FIG. 1 is a block diagram of the circuit of a broadcast receiver having an interference blanking circuit.

In the block diagram given in FIG. 1 of a stereo broadcast receiver there is shown an antenna 1, an input stage 2, an intermediate frequency stage 3 and a demodulator 4. In a stereo broadcast receiver the output of the demodulator is a multiplex signal that contains the low-frequency information and that occupies a frequency band with its upper limit at about 60 kHz. Following the demodulator there is connected a disturbance blanking circuit 5 that consists essentially of a gate circuit 6, a disturbance pulse detector 7 and a storage circuit 8. The interference detector 7 recognizes disturbances in the multiplex signal and controls a switch in the gate circuit 6, so that the signal path in the broadcast receiver is interrupted when a disturbance appears. During the blanking interval the signal stored in the storage circuit 8 is passed on to the following stages of the broadcast receiver. The signal in the storage circuit corresponds to the momentary value of the multiplex signal directly before the occurrence of the disturbance. Beyond the blanking circuit 5 there is connected a stereo decoder 9 which converts the multiplex signal into the low-frequency signals of the two stereo channels. The low frequency signals are amplified in a low-frequency final stage 10, from which they are furnished to the two loudspeakers 11.

Figure 2:
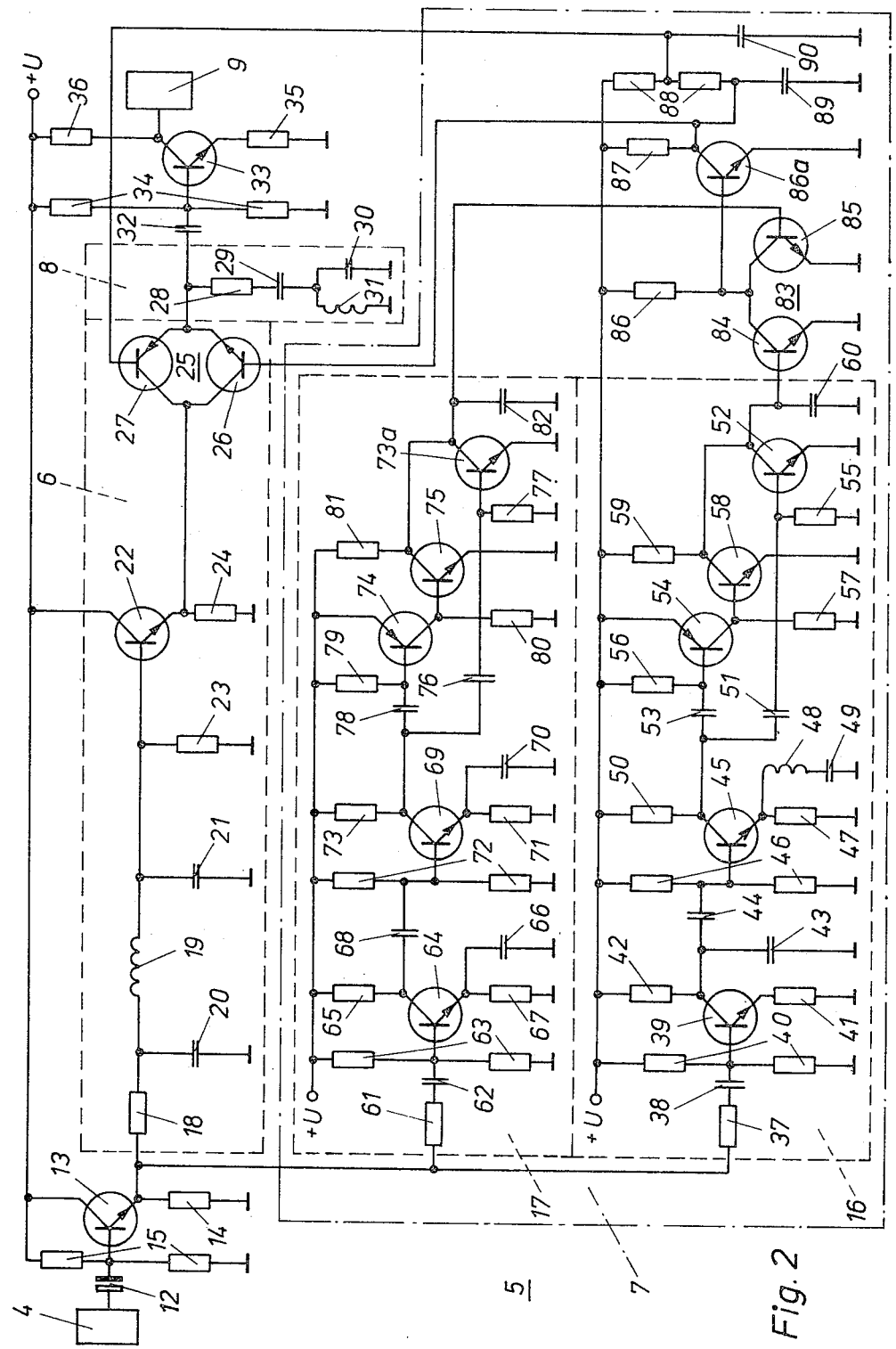
FIG. 2 is a circuit diagram of an interference blanking circuit utilizing a disturbance detector circuit according to the invention.

FIG. 2 shows the interference blanking circuit 5 in more detail. The multiplex signal appearing at the output of the demodulator 4 is furnished over a coupling capacitor 12 to an impedance converter 13 constituted by a transistor having its collector connected to the positive voltage supply bus +U and its emitter connected to an emitter resistor 14, the other end of which is grounded. Of course, the ground connection may be to the apparatus chassis or to some other arrangement for a substantially undisturbed return potential for the circuits. The base of the impedance coverter transistor 13 is biased by a voltage divider 15 connected between the positive voltage supply bus and ground. The emitter of the impedance converter 13, which is the output electrode in this case, is connected with the input of the gate circuit 6, and with the inputs of both the first recognition circuit 16 and the second recognition circuit 17 of the disturbance pulse detector 7. In the gate circuit 16 a resistor 18 in series with a coil 19 of which the ends are connected to ground respectively through two capacitors 20 and 21 constitute a delay line interposed between the emitter of the impedance converter 13 and a grounded terminating resistor 18 for delaying the multiplex signal. The delayed multiplex signal that appears at the ungrounded end of the terminating resistor 18 of the delay line is connected to the base of a second impedance converter transistor 22 that has its collector connected to the positive voltage supply bus and its emitter connected to a load resistance 24, the other end of which is grounded. The emitter of the impedance converter 22 has a connection furnishing the output of the stage to a switching circuit 25 that consists of an npn transistor 26 and a pnp transistor 27, the respective collectors of which are connected together and the emitters likewise. The common collector connection is the point to which the emitter of the impedance converter 22 is connected. The common emitter connection is connected to the storage circuit 8, which is constituted by the series connection of a resistor 28, a storage capacitor 29 and a parallel-resonant circuit composed of a capacitor 30 and a coil 31, both of which have one terminal grounded. The ungrounded end of this series circuit, where the resistor 28 is connected to the emitters of the switching circuit 25, is also connected to a coupling capacitor 32, the other terminal of which is connected to the base of an amplifier transistor 33, which base is also provided with a bias connection to a voltage divider 24 connected between the positive voltage supply +U and ground. The emitter of the amplifier transistor 33 is connected to a resistor 35, the other end of which is grounded, while the collector of this transistor is connected over another resistor 36, the other end of which is connected to the positive voltage supply bus +U. The output voltage of the interference blanking circuit 5 that is supplied to the stereo decoder 9 is taken from the collector of the amplifier transistor 33.

The switching condition of the two transistors 26 and 27 of the switching circuit 25 are controlled by outputs of the disturbance pulse detector 7, the circuit of which will now be described. The multiplex signal supplied to the first recognition circuit 16 reaches the base electrode of an amplifier transistor 39 after passing through a series circuit composed of a resistor 37 and a capacitor 38. The base of the amplifier transistor 39 is biased by a voltage divider 40 connected between the positive voltage supply bus and ground, which voltage divider together with the capacitor 38 forms a high-pass circuit. The emitter of the amplifier transistor 39 is connected to ground through an emitter resistor 41, while the collector of that transistor is connected on the one hand through a collector resistor 42 to the positive voltage supply bus +U and on the other hand to ground through a capacitor 43. The resistor 42 and the capacitor 43 together have a low-pass effect. The signal at the collector of the amplifier transistor 39 is coupled through a coupling capacitor 44 to the base of another amplifier transistor 45. The base bias of the amplifier transistor 45 is supplied by a voltage divider 46 connected between the positive voltage supply bus and ground. The emitter of the amplifier transistor 45 has a d.c. path to ground through a resistor 47 and another path to ground through a series resonant circuit formed of a coil 48 and a capacitor 49. The collector of the amplifier transistor 45 connected to a resistor 50, the other end of which is connected to the positive voltage supply bus and there are two coupling capacitors 51 and 53d connected to the collector of the amplifier transistor 45. The coupling capacitor 51 carries the signal forward to the base to an npn transistor 52, while the coupling capacitor 53 carries a signal to a pnp transistor 54. The npn transistor 52 has its emitter grounded directly and its base grounded through a resistor 55. The pnp transistor 54 has its emitter directly connected to the positive voltage supply bus and its base connected thereto over a resistor 56. The collector of the pnp transistor 54 is on the one hand grounded through the collector resistor 57 and on the other hand connected directly to the base of an inverter transistor 58, of which the emitter is directly grounded and the collector is connected over a resistor 59 with the positive voltage supply bus +U. The collectors of the inverter transistor 58 and of the npn transistor 52 are connected together and connected to a capacitor 60, the other terminal of which is grounded. This capacitively loaded common collector connection provides the output signal of the first recognition circuit 16.

At the input of the second recognition circuit 17 there is provided a resistor 61 in series with a capacitor 62, over which the input signal reaches the base of an amplifier transistor 64 provided with base bias by a voltage divider 63. The collector of the amplifier transistor 64 is connected through a resistor 65 to the positive voltage supply bus. The capacitor 62 and the voltage divider 63 form a high-pass circuit. The emitter of the amplifier circuit 64 is grounded through a resistor 67 that is bypassed by a capacitor 66, this combination allowing the lower frequencies but not the higher frequencies to be fed back and thereby providing a high-pass transmission effect. The signal present at the collector of the amplifier transistor 64 is furnished through a coupling capacitor 68 to a frequency-dependent amplifier stage constituted by an amplifier transistor 69, which, like its predecessor stage, is provided with an emitter resistor 71 and a capacitor 70 that bypasses only the higher frequencies, giving the stage a high-pass effect. Base bias for the amplifier transistor 69 is provided by a voltage divider 72 connected between the positive voltage supply bus and ground and acting, in cooperation with the coupling capacitor 68, as another high-pass circuit. The collector of the amplifier transistor 69, that is connected through a collector resistor 73 to the positive voltage supply bus provides an output to the parallel connection of an npn transistor 73a, on the one hand, and on the other hand to a pnp transistor 74 that is followed by an inverter transistor 75. The npn transistor 73a is provided with a coupling capacitor 76 and a grounded resistor 77 at its base, the pnp transistor likewise with a coupling capacitor 78 and a resistor 79, as well as a collector resistor 80, and the inverter transistor 75 with a collector resistor 81 in a manner similar to the constitution of the corresponding stages in the recognition circuit 16. The respective collectors of the inverter transistor 75 and of the npn transistor 73a are connected together and this common collector connection is capacitively loaded with a capacitor 82, the other terminal of which is grounded and provides the output signal of the second recognition circuit 17.

The output signals of the first and second recognition circuits 16 and 17 are respectively connected to the two inputs of an AND-circuit 83. The AND-circuit is constituted of two transistors 84 and 85 having their respective emitters directly grounded and their respective collectors connected together and to a collector resistor 86 through which they are connected to the positive voltage supply bus. The output signal of the AND-circuit 83 is available at the common collector connection and is supplied to the base of a switching transistor 86a, of which the emitter is grounded and the collector is connected through a collector resistor 87 to the positive voltage supply bus. The signal at the collector of the switching transistor 86a directly controls the base of the npn transistor 26 of the switching circuit 25. In parallel to the collector-emitter path of the switching transistor 86a is a capacitor 89 which is also in series with a voltage divider 88 connected between the collector of the switching transistor 86a and the positive voltage supply bus. The tap of the voltage divider 88 controls the base of the pnp transistor 27 of the switching circuit 25 and is capacitively loaded by a storage capacitor 90, the other terminal of which is grounded.

The multiplex signal present at the emitter of the impedance converter transistor 13 is delayed in the gate circuit 6 and supplied to the switching circuit 25 through the impedance converter 22. The undelayed multiplex signal is supplied both to the first recognition circuit 16 and the second recognition circuit 17. The response threshold of the first recognition circuit, shown in curve A of FIG. 3, corresponds to the overall characteristic produced in the combined effect of the high-pass circuit 38, 39, the low-pass circuit 42, 43 and the selective amplifiers 45, 47 and 48, 49. This response threshold of the first recognition circuit reaches a minimum at about 75 kHz, which means that there is a sensitivity maximum of the circuit at that frequency. The high-pass circuit 38, 39 serves to provide a response characteristic that is as steep as possible between the useful signal band and the frequency of maximum sensitivity of the disturbance recognition circuit.

If a positive disturbance pulse appears at the input of the first recognition circuit 16, a positive pulse will appear at the collector of the amplifier transistor 45. This positive pulse turns on the npn transistor 52, so that the capacitor 60 which was charged during the absence of disturbances is now quickly discharged. On the other hand, if a negative pulse appears at the input of the recognition circuit 16, the pnp transistor 54 and with it the inverter transistor 58 are turned on. Also in this case the capacitor 60 will be quickly discharged. Therefore, a negative pulse appears at the base of the transistor 84 of the AND-circuit 83 whenever a disturbance pulse appears, regardless of the polarity of the disturbance pulse.

Figure 3:
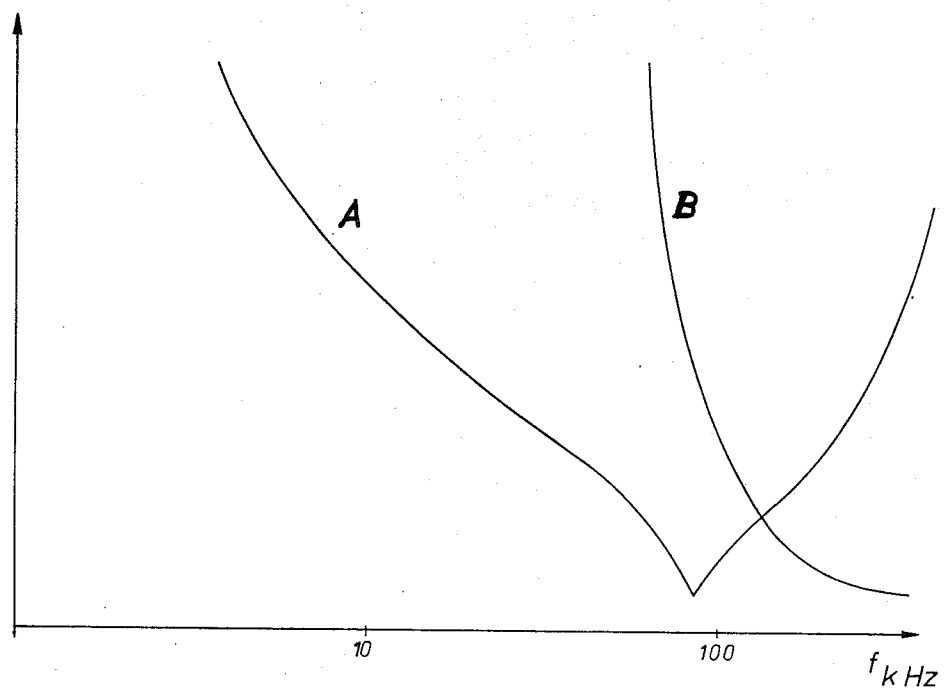
FIG. 3 is a graph showing the course of the disturbance recognition thresholds of the separate disturbance recognition circuits of a disturbance detector circuit according to FIG. 2.

Curve B of FIG. 3 shows the response threshold of the second recognition circuit 17. It is produced by the combined high-pass effects of the network 62, 63 and of the frequency-dependent amplifier stages 64, 66, 67 and 69, 70, 71. The second recognition circuit 17, therefore, is effective to recognize disturbance components of relatively high frequency. Since the high-pass circuits operate as differentiating circuits (in the mathematical sense), the disturbance pulses are converted into pulse sequences in each of which a positive spike is followed by a negative spike, or vice versa according to the polarity of the original pulse. Since it is difficult, however, to provide equality of amplitude for the positive and negative spikes, separate switching transistors for positive and negative polarities are provided in the second recognition circuit 17 just as they are provided in the first recognition circuit 16. Thus the response of the second recognition circuit produces a negative pulse for the capacitor 82 in each case. Whereas the capacitor 60 is of such electrical dimensions that a pulse appearing at the collector of the inverter transistor 58 or at that of the npn transistor 52 is not substantially broadened, the capacitor 92 serves to broaden the pulse considerably. That is necessary, because the first recognition circuit 16 responds more slowly than the second recognition circuit 17. Respective negative output pulses of the first and second recognition circuits 16 and 17 are supplied to the AND-circuit 83, whose transistors 84 and 85 are conducting so long as the recognition circuits 16 and 17 are quiescent. If only one of the two recognition circuits 16 and 17 reacts to its input by producing an output negative pulse, which means that no disturbance is actually present, one of the two transistors 84 and 85 of the AND-circuit 83 remains conducting and the potential at the collector connection of the AND-circuit remains practically unchanged. On the other hand, if as a result of a disturbance both of the recognition circuits 16 and 17 respond, both of the transistors 84 and 85 of the AND-circuit 83 are put into their non-conducting condition and the potential at the collector connection of the AND-circuit goes positive. The switching transistor 86a is thereby switched on and the potential at the base of the npn transistor 26 of the switching circuit 25 is practically grounded. The npn transistor 26 is thereby turned off and the signal path for the multiplex signal is consequently interrupted. The storage capacitor 90 and the pnp transistor 27 serve to prevent a persistent interruption of the multiplex signal path from occurring, for example during tuning. In the case in which both recognition circuits 16 and 17 are continuously beyond their response thresholds, the capacitor 90, which in the absence of disturbances remains practically at the potential of the positive voltage supply +U, is then so far discharged over the voltage divider 88 that the normally non-conducting pnp transistor 27 is put into its conducting condition. This bridges the switching path of the npn transistor 26 of the switching circuit 25, so that no more blanking can take place until the capacitor 90 is re-charged, which happens when the disturbance recognition rate falls off.

When no disturbance is present, the switching circuit 25 is closed (conducting) and the capacitor 29 of the storage circuit 8 has a charge that follows the multiplex signal. When a disturbance appears, the signal path through the switching circuit 25 is interrupted and the voltage value stored in the storage capacitor 29, which corresponds to the amplitude of the multiplex signal directly before the occurrence of the disturbance, is supplied to the amplifier stage 23. The parallel resonant circuit 30, 31 is tuned to the frequency of the stereo pilot signal and has the effect of isolating the voltage value stored in the capacitor 29 from the superimposed variation of the stereo pilot signal. In addition, the pilot signal oscillation is also maintained during the blanking interval, so that the pilot signal oscillation is supplied without interruption to the stereo decoder 9, with the further result that audible disturbances during oscillation build-up after the end of a blanking interval are prevented.

It will thus be seen that with the above-described disturbance pulse detector circuit, an interference blanking circuit can for the first time be arranged to provide reliable disturbance suppression even under extreme conditions, however strong or weak the signal being received may be. Although the invention has been described with reference to a particular illustrative example, it will be understood that variations may be made within the inventive concept.

I claim:

1. In an interference blanking circuit for a radio receiver which includes an interference detector circuit and a blanking switch interposed between the output of the demodulator of the receiver and the circuits for utilizing the demodulated signal, the improved interference detector circuit which comprises the combination of:
   first disturbance recognition means (16) connected to the output of the demodulator and having a sensitivity maximum in a first frequency region lying slightly above the frequency band of the utilizable demodulated signal for recognizing the effects of a disturbance in said frequency region;
   second disturbance recognition means (17) connected to the output of the demodulator for recognizing the high-frequency components of disturbances in a frequency region well above the frequency region in which said first disturbance recognition means is most sensitive, and
   means connected to the outputs of said first and second disturbance recognition means for providing a blanking signal for operating the blanking switch of the receiver to interrupt the demodulated signal of the receiver only when both said first and said second disturbance recognition means (16, 17) recognize disturbance components in their respective frequency regions of sensitivity.

2. Improved interference detector circuit as defined in claim 1, in which said first disturbance recognition means (16) has its greatest sensitivity of response between 70 and 100 kHz.

3. Improved interference detector circuit as defined in claim 1, in which said second disturbance recognition means (17) has its greatest sensitivity of response in a frequency range above 200 kHz.

4. Improved interference detector circuit as defined in claim 1, in which said first disturbance recognition means (16) includes high-pass circuit means (37, 38) for providing a steep response sensitivity characteristic with respect to frequency between the frequency band of the useful demodulated signal and the frequency of greatest response sensitivity of said first disturbance recognition means.

5. Improved interference detector circuit as defined in claim 1, in which said first disturbance recognition means (16) includes separate recognition threshold switches (52, 54) respectively for positive-going and for negative-going disturbance pulses.

6. Improved interference detector circuit as defined in claim 1, in which said second disturbance recognition means (17) is equipped with a plurality of differentiating circuits (61, 62; 65, 66; 70, 71) and includes recognition switching means (73a, 74) controlled by differentiated signals differentiated thereby.

7. Inproved interference detector circuit as defined in claim 1, in which said second disturbance recognition means (17) includes separate recognition switching means (73a, 74) respectively provided for operation upon recognition of disturbance pulses with positive-going leading edges and recognition of disturbance pulses with negative-going leading edges respectively.

8. Improved interference detector circuit as defined in claim 1, in which said means for interrupting the output of the demodulator of the receiver only when both said first and said second disturbance recognition means operate includes an AND-gate (83) and includes means for delaying the output of said second disturbance recognition means (17) and for applying said output thus delayed to an intput of said AND-gate.

9. Improved interference detector circuit as defined in claim 8, in which said delay means includes pulse-shaping circuit means (82) for broadening in time the output pulse of said second disturbance recognition means (17).

10. Improved interference detector circuit as defined in claim 1, in which means for preventing excessive blanking are provided which are arranged to bridge and thereby render ineffective the blanking switch for interrupting the output of the receiver demodulator when a predetermined number of blanking operations wiithin a predetermined time interval is exceeded.

11. Improved interference detector circuit as defined in claim 10, in which said means for preventing excessive blanking consists essentially of a capacitor (90) arranged to be subjected to variations in the amount of its charge in response to the control pulses utilized for operating the blanking switch.

* * * * *